(12) United States Patent
Shibata et al.

(10) Patent No.: US 7,304,900 B2
(45) Date of Patent: Dec. 4, 2007

(54) SEMICONDUCTOR MEMORY

(75) Inventors: Tomoyuki Shibata, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/386,650

(22) Filed: Mar. 23, 2006

(65) Prior Publication Data

US 2006/0215478 A1   Sep. 28, 2006

(30) Foreign Application Priority Data

Mar. 24, 2005   (JP)   ............................. 2005-086068

(51) Int. Cl.
*G11C 7/00* (2006.01)

(52) U.S. Cl. .................... 365/200; 365/230.03
(58) Field of Classification Search ................ 365/200
See application file for complete search history.

(56) References Cited

U.S. PATENT DOCUMENTS

| 5,307,316 | A | * | 4/1994 | Takemae ..................... 365/200 |
| 5,491,664 | A | * | 2/1996 | Phelan ........................ 365/200 |
| 5,889,710 | A | * | 3/1999 | Pascucci ..................... 365/200 |
| 6,115,828 | A | * | 9/2000 | Tsutsumi et al. .............. 714/7 |
| 6,522,590 | B2 | * | 2/2003 | Matsui et al. ................ 365/200 |
| 7,099,209 | B2 | * | 8/2006 | Kang et al. .................. 365/200 |
| 7,134,057 | B1 | * | 11/2006 | Kaushik et al. ............. 714/711 |

FOREIGN PATENT DOCUMENTS

JP    2004-55100    2/2004

* cited by examiner

*Primary Examiner*—Son L. Mai
(74) *Attorney, Agent, or Firm*—Whitham Curtis Christofferson & Cook, PC

(57) ABSTRACT

In a semiconductor memory having a plurality of memory banks that can be independently accessed, remedying bit registers that are substituted for defective memory cells are respectively provided for memory banks in a one-to-one relationship. Also, means for sharing the plurality of remedying bit registers in each memory bank is arranged.

5 Claims, 4 Drawing Sheets

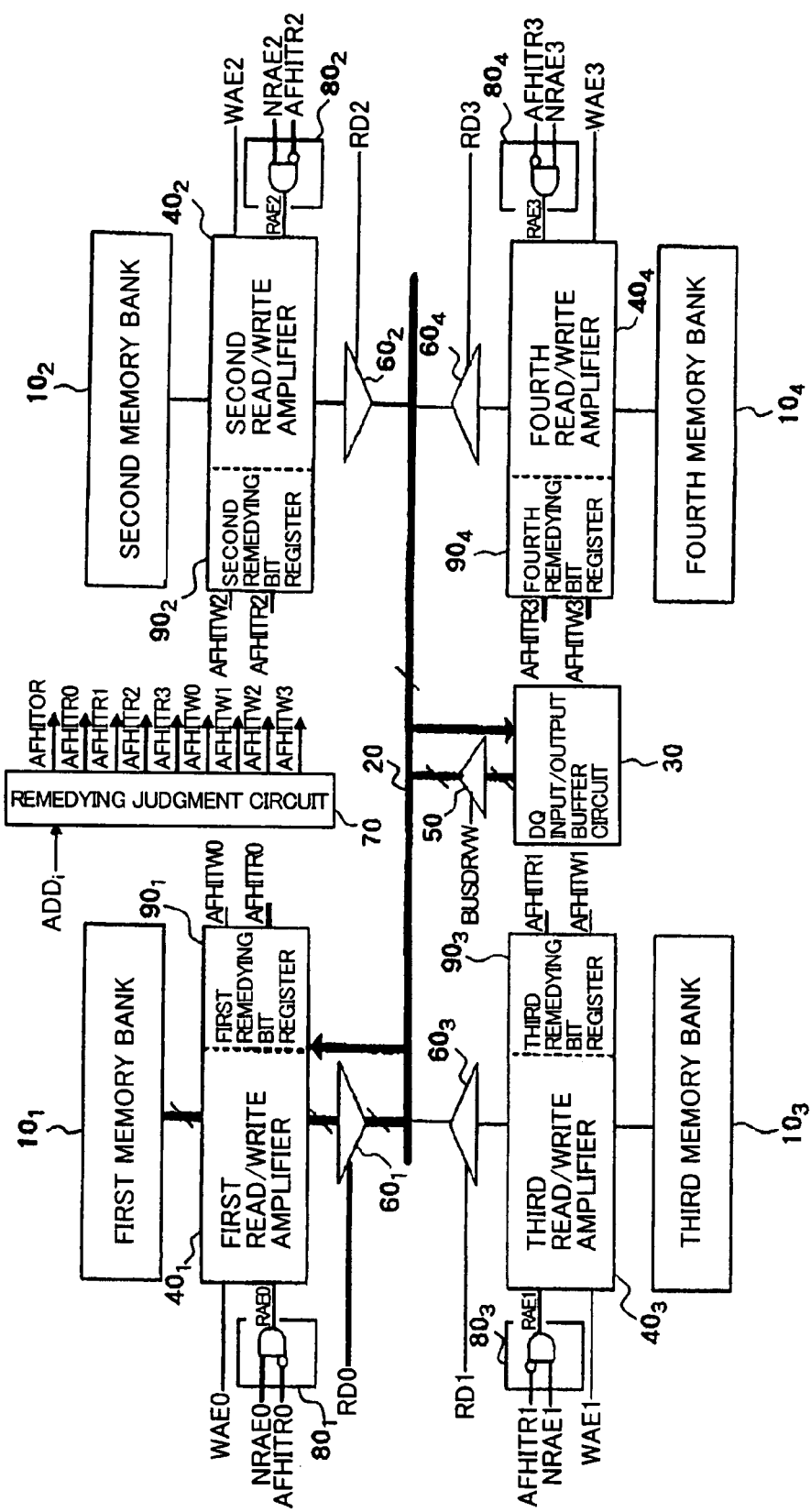
F I G. 1

SEMICONDUCTOR MEMORY

BACKGROUND OF THE INVENTION

1. Field of the Invention

The present invention relates to a semiconductor memory, and in particular, relates to a semiconductor memory in which a memory cell array is divided into a plurality of memory banks that can be accessed independently.

2. Description of the Related Art

In semiconductor memory devices in recent years, the miniaturization of memory cells and peripheral circuits that has accompanied the great increase in memory capacity has brought with it an increase in the incidence of defective parts that are unintentionally incorporated. Semiconductor memory device are therefore provided with both normal memory cells, which are memory cells for normal use, and redundant memory cells, which substitute when a defect occurs in a normal memory cell; and the defect remedy technology for replacing normal memory cells in which defects have been detected (hereinbelow referred to as "defective memory cells") with redundant memory cells to improve productivity yield has become a crucial technology.

In order to replace a defective memory cell with a redundant memory cell, the address of the defective memory cell (hereinbelow referred to as "failed addresses") must be stored. Nonvolatile memory elements for storing fail addresses include fuses in which a conductor is fused and insulated by a laser or electric current, and antifuses in which an overvoltage is applied to an insulator to break down the insulator in order to cause conduction.

In fuses that are typically used as in semiconductor memory devices of the prior art, a laser light is used when testing the memory chip to fuse conductors and thus store fail addresses, and as memory elements, these fuses have relatively stable characteristics. However, the method in which a laser is used to melt a fuse and store fail addresses suffers from the problem that, once a memory chip has been sealed within a package (assembled), defects that are detected can no longer be remedied, and this method is therefore unable to adequately improve productivity yield. In recent years, however, antifuses are coming into use that are capable of remedying defective memory cells even after assembly.

The antifuse can write address information of the defective cells with a relatively small current, and the antifuse can not only relieve defects after the assembly has been sealed, but can also carry out testing a device with the function of short-circuiting the antifuse element at comparatively low cost.

Japanese Patent Laid-Open No. 2004-55100 discloses a technique in which, in a memory module provided with a plurality of volatile memories and a nonvolatile memory, the fail address of volatile memories that are judged to be defects in memory module testing and the information that is used to distinguish the volatile memories are stored in nonvolatile memory, the information is transferred from nonvolatile memory to the volatile memories upon start-up of the system, and access is made to a corresponding redundant memory cell when access is made to the fail address in the volatile memories, thereby relieving the volatile memories that are already mounted on the memory module.

For a semiconductor memory in which a memory cell array is divided into a plurality of memory banks that can be accessed independently, it is necessary to provide a plurality of redundant memory cells that are to be used in the respective memory cells. In particular, productivity yields of semiconductor memories can be improved when the plurality of redundant memory cells can be shared by each memory cell, and the control circuit for redundant memory cells can be further simplified when the plurality of redundant memory cells are arranged together. However, according to the configuration in which a plurality of redundant memory cells is arranged together, an exclusive area for these cells must be ensured. Also, usually, since redundant memory cells are arranged away from memory banks, it is necessary to use a large amount of wiring becomes long which causes an increase in the layout area. Further, there is a possibility that access time to the memory cells becomes longer.

In recent information processing devices and the like, because of the increased speed of processing devices, such as CPUs, the access time in semiconductor memory causes a bottomneck for the processing speed of the information processing device. For that reason, further demands are made on the increase in memory capacity and on shortening of the access time.

SUMMARY OF THE INVENTION

Accordingly, it is an object of the present invention to provide a semiconductor memory capable of preventing an increase in the layout area and in access time by providing redundant memories.

Also, it is another object of the present invention to provide a semiconductor memory capable of improving productivity by using redundant memories more efficiently.

To attain the above-described objects, according to the present invention, a remedying bit register that are substituted for defective memory cells are respectively provided for memory banks in a one-to-one relationship.

Therefore, the remedying bit register can be arranged close to each memory bank, and the connection wiring between the remedying bit register and each memory bank can be reduced to the shortest distance. Accordingly, access speed to the memory banks is prevented from being lowered and the layout area used to arrange the remedying bit registers is reduced to the minimum.

Further, according to the present invention, means for sharing the plurality of remedying bit registers in each memory bank is arranged. With this arrangement, even if a plurality of defective memory cells is generated in any one of the memory banks, the possibility of relieving these defective memory cells is increased. Therefore, defective memory cells can be relieved more efficiently, and productivity yields can be further improved.

The above and other objects, features, and advantages of the present invention will become apparent from the following description with reference to the accompanying drawings which illustrate examples of the present invention.

BRIEF DESCRIPTION OF THE DRAWINGS

FIG. 1 is a block diagram showing a configuration of a semiconductor memory according to a first embodiment of the present invention;

DESCRIPTION OF THE PREFERRED EMBODIMENTS

First Embodiment

Figure 2:
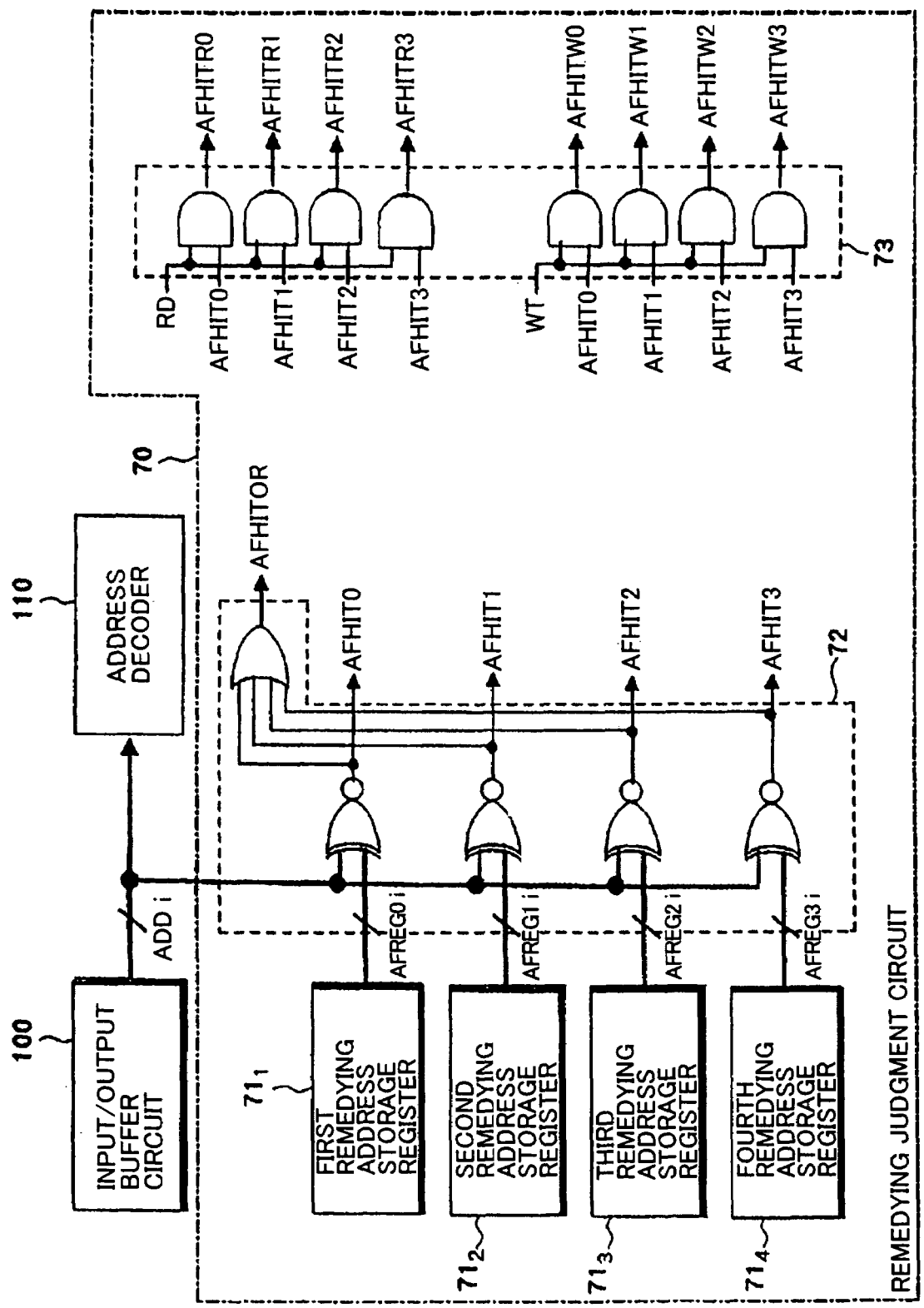
FIG. 2 is a circuit diagram showing a configuration example of the remedying judgment circuit shown in FIG. 1.

As shown in FIG. 1, a semiconductor memory according to the first embodiment is provided with a plurality of memory banks 10 (first memory bank $10_1$ to fourth memory bank $10_4$ in FIG. 1) that can be independently accessed, read/write bus 20 used for each memory bank 10 in common and used as a bus for data transmission, DQ input/output buffer circuit 30 arranged between a DQ terminal, i.e., a data input/output terminal and used to hold input/output data temporarily, a plurality of read/write amplifiers 40 (first read/write amplifier $40_1$ to fourth read/write amplifier $40_4$ in FIG. 1) arranged so as to correspond to each memory bank 10 and used to read data from memory bank 10 and to write data to memory bank 10, write driver circuit 50 for transmitting write data output from DQ input/output buffer circuit 30 to read/write bus 20, a plurality of read driver circuits 60 (first read driver circuit $60_1$ to fourth read driver circuit $60_4$ in FIG. 1) arranged so as to correspond to each memory bank 10 and used to transmit read data to read/write bus 20, remedying judgment circuit 70 for judging whether access to a defective memory cell is made or not, and a plurality of switch control circuits 80 (first switch control circuit $80_1$ to fourth switch control circuit $80_4$ in FIG. 1) arranged so as to correspond to each memory bank 10 and used to control the operation of the corresponding read/write amplifier in accordance with the judgment result by remedying judgment circuit 70.

Incidentally, in FIG. 1, four memory banks 10, four read/write amplifiers 40, four read driver circuits 60, and four switch control circuit 80 are provided, however, there is no limitation on the number of these and any number can be used.

As shown in FIG. 2, remedying judgment circuit 70 is provided with a plurality of remedying address storage registers 71 (first remedying address storage register $71_1$ to fourth remedying address storage register $71_4$ in FIG. 2) in which addresses of defective memory cells are stored, comparison circuit 72 for comparing the addresses of the defective memory cells, stored in remedying address storage registers 71, and address signals input from the outside, and logic gate circuit 73 for outputting the comparison result of comparison circuit 72 in accordance with data writing or data reading in the semiconductor memory.

Incidentally, in FIG. 2, four remedying address storage registers 71 are provided, however, any number of remedying address storage registers 71 can be used as long as the number corresponds to the number of memory banks 10.

The antifuse elements are used, for example, as first remedying address storage register $71_1$ to fourth remedying address storage register $71_4$. Nonvolatile memories, i.e., PROM or EPROM may be used as remedying address storage registers 71. When antifuse elements are used as remedying address storage registers 71, defective memory cells can be relieved after the semiconductor memory is fabricated.

In the first embodiment, first remedying address storage register $71_1$ to fourth remedying address storage register $71_4$ and first memory bank $10_1$ to fourth memory bank $10_4$ are in a one-to-one relationship. When a defective memory cell is produced in any memory bank 10, the address thereof is stored in corresponding remedying address storage register 71. For example, the address of a defective memory cell in first memory bank $10_1$ is stored in first remedying address storage register $71_1$, and the address of a defective memory cell in second memory bank $10_2$ is stored in second remedying address storage register $71_2$. Also, the address of a defective memory cell in third memory bank $10_3$ is stored in third remedying address storage register $71_3$, and the address of a defective memory cell in fourth memory bank $10_4$ is stored in fourth remedying address storage register $71_4$.

Comparison circuit 72 is provided with a plurality of exclusive OR circuits for comparing the addresses of the defective memory cells, stored in first remedying address storage register $71_1$ to fourth remedying address storage register $71_4$, with the addresses supplied from the outside and for detecting consistency/inconsistency between them and outputs remedying address hit signals AFHIT0 to AFHIT3, i.e., the detection results thereof. Comparison circuit 72 is also provided with an exclusive OR circuit and outputs remedying address detection signal AFHITOR that is used in the second embodiment which will be described later and is the exclusive OR result of remedying address hit signals AFHIT0 to AFHIT3.

Logic gate circuit 73 is provided with a plurality of AND circuits, and outputs remedying address hit signals AFHITR0 to AFHITR3 for reading data which is the AND results of remedying address hit signals AFHIT0 to AFHIT3 and internal read command RD of the semiconductor memory, and outputs remedying address hit signals AFHITW0 to AFHITW3 for writing data which is the AND results of remedying address hit signals AFHIT0 to AFHIT3 and internal write command WT of the semiconductor memory.

First switch control circuit $80_1$ to fourth switch control circuit $80_4$ in FIG. 1 are respectively provided with AND circuits, and output control signals RAE0 to RAE3 that are used to control the operation for reading data from first memory bank $10_1$ to fourth memory bank $10_4$ by first read/write amplifier $40_1$ to fourth read/write amplifier $40_4$.

Further, NRAE (Normal Read Amp Enable)0 to NRAE3 represent a read enable signal for activating a read amplifier that is provided in read/write amplifier 40 and that is used to read data from memory bank 10, and WAE (Write Amp Enable)0 to WAE3 represent a write enable signal for activating a write amplifier that is used to store data into memory bank 10.

RD0 to RD3 that are input to first read driver circuit $60_1$ to fourth read driver circuit $60_4$ are drive signals for transmitting the read data that is read from memory bank 10 to read/write bus 20, and BUSDRVW that is input into write driver bus circuit 50 is a drive signal for transmitting the write data that is to be stored in memory bank 10 to read/write bus 20. These signals, the above-mentioned internal read command RD, internal write command WT (see FIG. 2) are signals that are output in accordance with a read command or a write command supplied from the outside with predetermined timing from a control circuit, not shown, provided in the semiconductor memory and that are usually used to control the semiconductor memory. This control circuit may be configured in a known manner, and thus explanations thereof are omitted.

In the semiconductor memory according to the first embodiment, remedying bit registers 90 (first remedying bit register $90_1$ to fourth remedying bit register $90_4$ in FIG. 1), i.e., redundant memory cells in which data is stored instead of defective memory cells, are respectively arranged for first read/write amplifier $40_1$ to fourth read/write amplifier $40_4$ that are provided so as to correspond to each memory bank 10. First remedying bit register $90_1$ to fourth remedying bit register $90_4$ are assigned to first memory bank $10_1$ to fourth memory bank $10_4$ in a one-to-one relationship. When access is made to a defective memory cell in memory bank 10, corresponding remedying bit register 90 is accessed instead of the defective memory cell.

Specifically, when a defective memory cell is produced in first memory bank $10_1$, data is stored in first remedying bit register $90_1$ which corresponds to first memory bank $10_1$, and when a defective memory cell is produced in second memory bank $10_2$, data is stored in second remedying bit register $90_2$ which corresponds to second memory bank $10_2$. Also, when a defective memory cell is produced in third memory bank $10_3$, data is stored in third remedying bit register $90_3$ which corresponds to third memory bank $10_3$, and when a defective memory cell is produced in fourth memory bank $10_4$, data is stored in fourth remedying bit register $90_4$ which corresponds to fourth memory bank $10_4$.

As shown in FIG. 2, when access to memory bank 10 is made, the address signal input from the outside is supplied to address decoder 110 and remedying judgment circuit 70, through input/output buffer circuit 100 for address signals. Address decoder 110 generates row address and column address from the address signal that is input, and then decodes row address and column address to enable data to be written/read in/from the memory cell that is the access destination.

On the other hand, comparison circuit 72 in remedying judgment circuit 70 compares the addresses of the defective memory cell, stored in first remedying address storage register $71_1$ to fourth remedying address storage register $71_4$, and the address signals input from the outside, and outputs a remedying address hit signal (one of AFHIT0 to AFHIT3) at a significant value, which corresponds to memory bank 10 in which access is made, when the address of the defective memory cell coincides with the address signal.

Logical gate circuit 73 outputs a corresponding remedying address hit signal to be read (one of AFHITR0 to AFHITR3) at a significant value when data is read from memory bank 10, and outputs a corresponding remedying address hit signal to be written (one of AFHITW0 to AFHITW3) at a significant value when data is written in memory bank 10.

Remedying address hit signals for reading AFHITR0 to AFHITR3 and remedying address hit signals for writing AFHITW0 to AFHITW3 are used as enable signals for activating remedying bit register 90. Remedying bit register 90 holds the write data transmitted through read/write bus 20 when it receives the remedying address hit signal for writing. Also, remedying bit register 90 outputs the held data to corresponding read driver circuit 60 when it receives the remedying address hit signal for reading data. At this time, read driver circuit 60 transmits the data that is received from remedying bit register 90 to read/write bus 20 together with the timing of drive signal RD0 to RD3.

First switch control circuit $80_1$ to fourth switch control circuit $80_4$ generate AND results of read enable signals NRAE0 to NRAE3 supplied from the control circuit in the semiconductor memory and remedying address hit signals for reading AFHITR0 to AFHITR3, and outputs control signals RAE0 to RAE3 for controlling the operation of the read amplifier. First read/write amplifier $40_1$ to fourth read/write amplifier $40_4$ stops the operation of reading data from corresponding data bank 10 in accordance with control signals RAE0 to RAE3 output from first switch control circuit $80_1$ to fourth switch control circuit $80_4$ when data is read from corresponding remedying bit register 90.

For example, when the address signal input from the outside coincides with the address stored in first remedying address storage register $71_1$, comparison circuit 72 outputs remedying address hit signal AFHIT0 at a significant value. Also, logic gate circuit 73 outputs corresponding remedying address hit signal AFHITR0 for reading data at a significant value when data is read, and outputs corresponding remedying address hit signal AFHITW0 for writing data at a significant value when data is written. In this case, data is written in first remedying bit register $90_1$ arranged so as to correspond to first memory bank $10_1$. Further, read driver circuit $60_1$ transmits the data received from remedying bit register $90_1$ to read/write bus 20 together with the timing of driving signal RD0.

First switch control circuit $80_1$ outputs control signal RAE0 for controlling the operation of the read amplifier, i.e., AND result of enable signal NRAE0 supplied from the control circuit in the semiconductor memory, and outputs remedying address hit signal AFHITR0 for reading data. First read/write amplifier $40_1$ stops the operation of reading data from first memory bank $10_1$ in accordance with control signal RAE0 output from first switch control circuit $80_1$.

Further, in the configuration shown in FIG. 1, when data is stored in remedying bit register 90, the data transmitted through read/write bus 20 is stored not only in remedying bit register 90 but also in memory bank 10. As this reason, when data is stored in remedying bit register 90, the access destination in memory bank 10 is the defective memory cell, there are no cases in which data stored in the defective memory cell is read, and no stop control for the write amplifier is performed because it causes an increase in unnecessary control circuits. Switch control circuit 80 may be configured similarly to the read amplifier in order to stop the operation of the write amplifier when data is stored in remedying bit register 90.

According to the semiconductor memory of the first embodiment, since remedying bit register 90 in which data is stored instead of in the defective memory cell, is arranged so as to correspond to each memory bank 10, remedying bit register 90 and memory bank 10 can be closely arranged and connection wiring between remedying bit register 90 and memory bank 10 can be reduced to the shortest distance. Therefore, the access speed to the memory bank is prevented from being lowered, and the layout area used to arrange the remedying bit register can be reduced to the minimum.

Second Embodiment

The first embodiment shows the configuration in which the remedying bit register which has data stored in it instead of in the defective memory cell, is arranged so as to correspond to each memory cell. However, in this configuration, since there is a limitation on the number of remedying bit registers, when a plurality of defective memory cells is generated in one memory bank, there is a possibility in that only a part of the defective memory cells can be relived. In the semiconductor memory according to the second embodiment, the plurality of remedying bit registers shown in the first embodiment can be shared by each memory bank.

Figure 3:
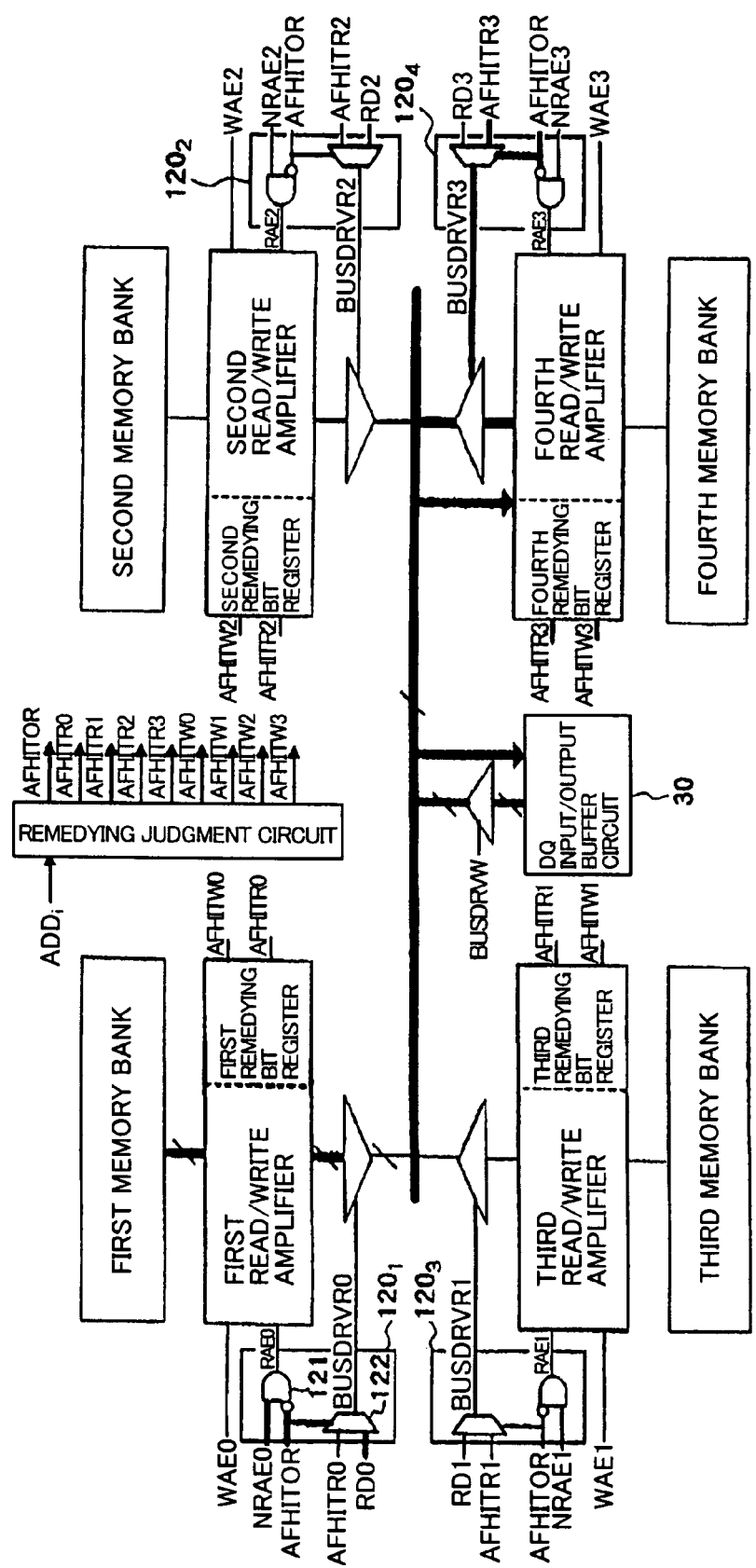
FIG. 3 is a block diagram showing a configuration of a semiconductor memory according to a second embodiment of the present invention.

As shown in FIG. 3, configurations of a plurality of switch control circuits 120 (first switch control circuit 120₁ to fourth switch control circuit 120₄) are arranged so that each memory bank is different from those of the first embodiment. The other configurations of the second embodiment are similar to those of the first embodiment, and therefore explanations thereof are omitted.

Switch control circuit 120 of the second embodiment is provided with AND circuit 121 for generating a control signal used to control the operation of reading data from the memory bank by the read/write amplifier when the data is read from the remedying bit register and selector circuit 122 for generating a control signal used to stop operations except the corresponding read driver circuit when the data is read from the remedying bit register.

AND circuit 121 outputs the AND result of read enable signal (NRAE0 to NRAE3) supplied from the control circuit in the semiconductor memory and remedying address detection signal AFHITOR output from remedying judgment circuit 70, and generates control signals RAE0 to RAE3 used to stop the operation of reading data from the memory bank by the read/write amplifier when the data is read from the remedying bit register.

Selector circuit 122 receives remedying address hit signals AFHITR0 to AFHITR3 that are to be read and drive signals RD0 to RD3 for the read driver circuit as inputs, and outputs remedying address hit signals AFHITR0 to AFHITR3 when the defective memory cells are relieved, and outputs drive signals RD0 to RD3 to read driver circuit 60 when the data is read from the memory bank, in accordance with remedying address detection signals AFHITOR output from remedying judgment circuit 70.

In the semiconductor memory according to the second embodiment, the address of the defective memory cell that is generated in any memory bank is stored in the first remedying address storage register to the fourth remedying address storage register arranged in the remedying judgment circuit shown in FIG. 2. When data is stored in the first remedying address storage register to the fourth remedying address storage register, it is stored in the corresponding remedying bit register in accordance with the addresses stored in the first remedying address storage register to the fourth remedying address storage register. Further, when data is read from the first remedying address storage register to the fourth remedying address storage register, it is read from the corresponding remedying bit register in accordance with the addresses stored in the first remedying address storage register to the fourth remedying address storage register.

Hereinafter, operation of the semiconductor memory according to the second embodiment is specifically explained with reference to FIGS. 4A and 4B using an example in which the address of the defective memory cell in the first memory bank is stored in the fourth remedying address storage register.

Figure 4A:
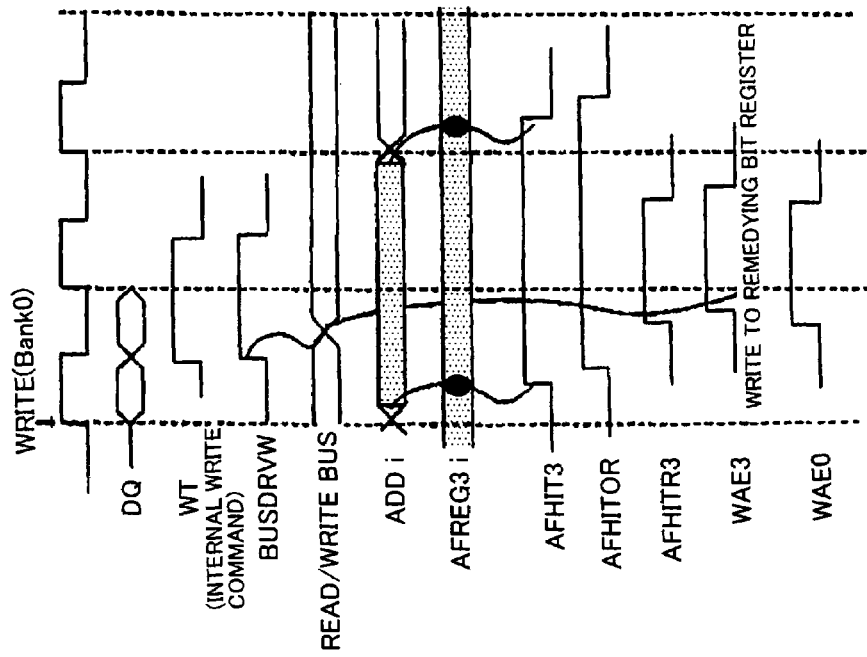
FIG. 4A is a timing chart showing an operation when data is written in the remedying bit register arranged in the semiconductor memory shown in FIG. 3.

First, when data is stored in the fail address in the first memory bank, as shown in FIG. 4A, data that is to be written is input into the DQ input/output buffer circuit through the DQ terminal. Internal write command WT is generated according to a write command input from the outside, and drive signal BUSDRVW for driving the write driver circuit is generated. The data that is to be written and that is held by the DQ input/output buffer circuit is transmitted to the read/write bus together with the timing of driving signal BUSDRVW.

Also, address signal ADDi input from the outside is supplied to the remedying judgment circuit through an address input/output buffer circuit. In this description, since address signal ADDi coincides with address AFHIT3i stored in the fourth remedying address storage register, remedying address hit signal AFHIT3 is output from the comparison circuit at a significant value, and remedying address hit signal AFHITW3 for data writing is output from the logic gate circuit at a significant value.

Remedying address hit signal AFHITW3 for data writing is supplied to the fourth remedying bit register of the fourth memory bank, and the fourth remedying bit register stores the data that is transmitted through the read/write bus together with the timing of enable signal WAE3 supplied from the control circuit, not shown.

Figure 4B:
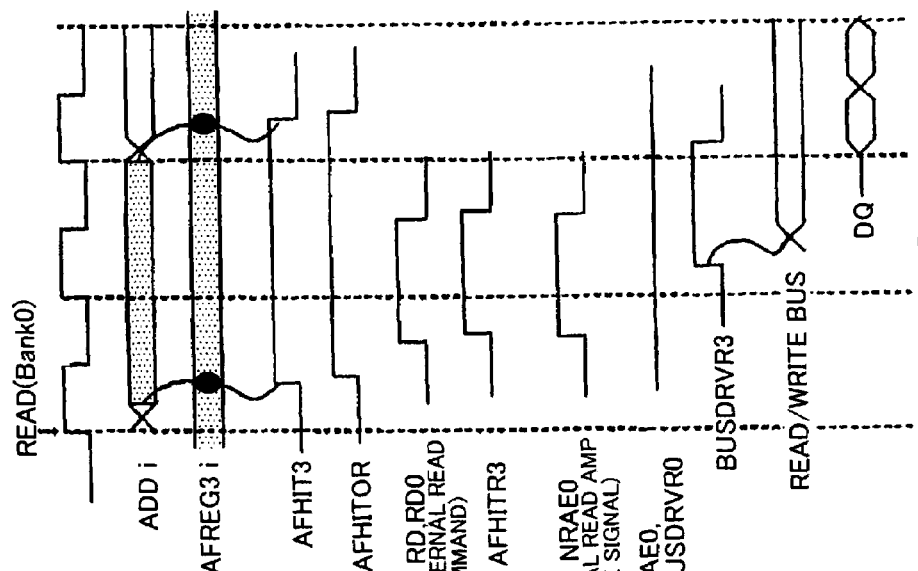
FIG. 4B is a timing chart showing an operation when data is read from the remedying bit register arranged in the semiconductor memory shown in FIG. 3.

On the other hand, when data is read from the fail address in the first memory bank, as shown in FIG. 4B, address signal ADDi input from the outside is supplied to the remedying judgment circuit through the address input/output buffer circuit. In this description, since address signal ADDi coincides with address AFREG3i stored in the fourth remedying address storage register, address hit signal AFHIT3 and remedying address detection signal AFHITOR are output from the comparison circuit at significant values, and remedying address hit signal AFHITR3 for reading data is output from the logic gate circuit at a significant value.

Remedying address hit signal AFHITR for reading data is supplied to the fourth remedying bit register of the fourth memory bank, and the fourth remedying bit register outputs the held data to the forth read driver circuit, which corresponds to the fourth remedying bit register.

At this time, in the first memory bank to the fourth memory bank, read enable signals NRAE0 to NRAE3 supplied from the control circuit in the semiconductor memory are masked by each AND circuit 121 in first switch control circuit 120₁ to fourth switch control circuit 120₂, and the operation of each read amplifier is stopped by control signals RAE0 to RAE3. Also, remedying address hit signals AFHITR0 to AFHITR3 are supplied from respective selector circuits 122 in first switch control circuit 120₁ to fourth switch control circuit 120₂ to corresponding read driver circuits. In this description, since only remedying address hit signal AFHITR3, which corresponds to the fourth memory bank and which is for reading data, is the significant value, drive signal BUSDRVR3 is supplied to only the fourth read driver circuit, and the data stored in the fourth remedying bit register is transmitted from the fourth read driver circuit to the read/write bus.

According to the semiconductor memory of the second embodiment, the plurality of remedying bit registers can be shared in each memory bank. Therefore, even if a plurality of defective memory cells is generated in one memory bank, the possibility for relieving the defective memory cells is increased. Accordingly, in addition to the effects of the semiconductor memory according to the first embodiment, the defective memory cells can be relieved effectively and productivity yields can be further improved.

Further, since the plurality of remedying bit registers is shared in one memory bank without inserting a logic circuit or the like into the usual data read/write path relative to the memory bank, the access speed does not become lower and the layout area does not increase.

While preferred embodiments of the present invention have been described using specific terms, such description is for illustrative purposes only, and it is to be understood that changes and variations may be made without departing from the spirit or scope of the following claims.

What is claimed is:

1. A semiconductor memory having a plurality of memory banks that can be independently accessed, comprising:
   a plurality of read/write amplifiers respectively provided for said plurality of memory banks in a one-to-one relationship and used to read and write data from/to memory cells in said memory banks;
   a plurality of remedying bit registers shared by said plurality of memory banks and provided as redundant memory cells that are used instead of defective memory cells in said memory banks;
   a remedying judgment circuit for judging whether access is made to said defective memory cells or not; and
   a switch control circuit device for stopping each operation of said read/write amplifiers when access is made to said defective memory cells.

2. The semiconductor memory according to claim 1, wherein said remedying bit registers are arranged in said read/write amplifiers.

3. The semiconductor memory according to claim 1, wherein said switch control circuit stops each operation of said read/write amplifiers only when data is read from said defective memory cells.

4. The semiconductor memory according to claim 1, wherein said remedying judgment circuit comprises:
   a plurality of remedying address storage registers in which the addresses of said defective memory cells are stored; and
   a comparison circuit for comparing the addresses of the defective memory cells, stored in said remedying address storage registers, with address signals input from the outside.

5. The semiconductor memory according to claim 4, wherein said remedying address storage registers are provided with antifuse elements stored with the addresses of said defective memory cells.

* * * * *